(12) United States Patent
Gruber et al.

(10) Patent No.: US 12,074,606 B2
(45) Date of Patent: Aug. 27, 2024

(54) REFERENCE BUFFER CIRCUIT, ANALOG-TO-DIGITAL CONVERTER SYSTEM, RECEIVER, BASE STATION AND MOBILE DEVICE

(71) Applicant: Intel Corporation, Santa Clara, CA (US)

(72) Inventors: Daniel Gruber, St. Andrae (AT); Christian Lindholm, Villach (AT); Martin Clara, Santa Clara, CA (US); Giacomo Cascio, Villach (AT)

(73) Assignee: Intel Corporation, Santa Clara, CA (US)

( * ) Notice: Subject to any disclaimer, the term of this patent is extended or adjusted under 35 U.S.C. 154(b) by 733 days.

(21) Appl. No.: 17/131,811

(22) Filed: Dec. 23, 2020

(65) Prior Publication Data
US 2022/0200615 A1 Jun. 23, 2022

(51) Int. Cl.
*H03M 1/08* (2006.01)
*H03K 19/003* (2006.01)
(Continued)

(52) U.S. Cl.
CPC .... *H03M 1/0827* (2013.01); *H03K 19/00384* (2013.01); *H03K 19/018578* (2013.01); *H04B 1/12* (2013.01)

(58) Field of Classification Search
None
See application file for complete search history.

(56) References Cited

U.S. PATENT DOCUMENTS

2020/0274545 A1\* 8/2020 Schifmann .......... H03M 1/1215

OTHER PUBLICATIONS

Zhou Yuan et al: "A 12-b 1-GS/s 31.5-mW Time-Interleaved SAR ADC With Analog HPF-Assisted Skew Calibration and Randomly Sampling Reference ADC", IEEE Journal of Solid-State Circuits, IEEE, USA, vol. 54, No. 8, May 31, 2019 (May 31, 2019), pp. 2207-2218, XP011736154, ISSN: 0018-9200, DOI: 10.1109/JSSC. 2019.2915583 [retrieved on 2019-0-22] section V. A; * abstract; figure 8 *.

(Continued)

*Primary Examiner* — Jany Richardson
(74) *Attorney, Agent, or Firm* — 2SPL Patent Attorneys PartG mbB; Yong Beom Hwang

(57) ABSTRACT

A reference buffer circuit for an analog-to-digital converter is provided. The reference buffer circuit includes a first input node configured to receive a first bias signal of a first polarity from a first signal line. Further, the reference buffer circuit includes a second input node configured to receive a second bias signal of a second polarity from a second signal line. Additionally, the reference buffer circuit includes a first output node configured to output a first reference signal of the first polarity. A first buffer amplifier is coupled between the first input node and the first output node. The reference buffer circuit includes in addition a second output node configured to output a second reference signal of the second polarity. A second buffer amplifier is coupled between the second input node and the second output node. Further, the reference buffer circuit includes a first coupling path comprising a first capacitive element. The first coupling path is coupled between the first output node and the second input node. In addition, the reference buffer circuit includes a second coupling path comprising a second capacitive element. The second coupling path is coupled between the second output node and the first input node.

20 Claims, 11 Drawing Sheets

(51) Int. Cl.
*H03K 19/0185* (2006.01)
*H04B 1/12* (2006.01)

(56) References Cited

OTHER PUBLICATIONS

Kull Lukas et al: "A 110 mil 6 bit 36 GS/s interleaved SAR ADC for 100 GBE occupying 0.048 mm2 in 32 nm 801 CMDS", 2014 IEEE Asian Solid-State Circuits Conference (A-SSCC), IEEE, Nov. 10, 2014 (Nov. 10, 2014), pp. 89-92, XP032719813, DOI: 10.1109/ASSCC.2014.7008867 ISBN: 978-1-4799-4090-5 [retrieved on Jan. 13, 2015] * abstract * * figure 5 *.

* cited by examiner

US 12,074,606 B2

REFERENCE BUFFER CIRCUIT, ANALOG-TO-DIGITAL CONVERTER SYSTEM, RECEIVER, BASE STATION AND MOBILE DEVICE

FIELD

Examples relate to a reference buffering for Analog-to-Digital Converters (ADCs). In particular, examples relate to a reference buffer circuit for an ADC, an ADC system comprising the reference buffer circuit, a receiver comprising the ADC system, a base station comprising the receiver and a mobile device comprising the receiver.

BACKGROUND

In ADCs such as time-interleaved ADCs or pipelined ADCs significant crosstalk can occur between the sub-ADC references. In some implementations every sub-ADC has its own reference buffer to allow for some isolation of reference voltages between the sub-ADCs. One of the simplest buffer circuits is a source follower. A source follower structure is simple, small, power efficient and broadband due to low output impedance. But source followers suffer from the effect that the gate-source capacitance couples the output of the buffer to the bias potential and resulting in kickback of the output to the bias lines.

Hence, there may be a desired for improved reference buffering for ADCs.

BRIEF DESCRIPTION OF THE FIGURES

Some examples of apparatuses and/or methods will be described in the following by way of example only, and with reference to the accompanying figures, in which.

DETAILED DESCRIPTION

Figure 1:
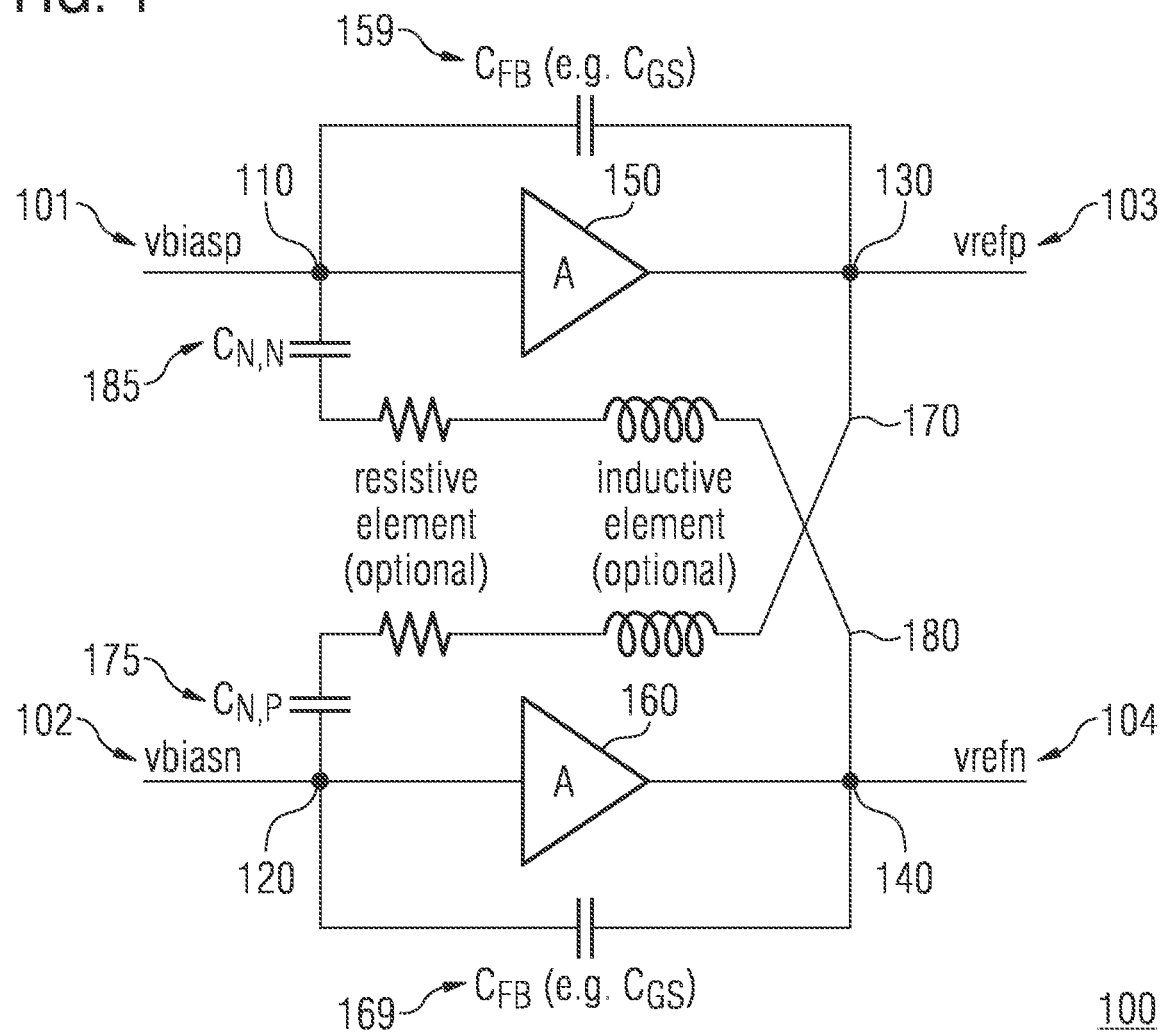
FIG. 1 illustrates a first example of a reference buffer circuit.

Some examples are now described in more detail with reference to the enclosed figures. However, other possible examples are not limited to the features of these embodiments described in detail. Other examples may include modifications of the features as well as equivalents and alternatives to the features. Furthermore, the terminology used herein to describe certain examples should not be restrictive of further possible examples.

Throughout the description of the figures same or similar reference numerals refer to same or similar elements and/or features, which may be identical or implemented in a modified form while providing the same or a similar function. The thickness of lines, layers and/or areas in the figures may also be exaggerated for clarification.

When two elements A and B are combined using an "or", this is to be understood as disclosing all possible combinations, i.e. only A, only B as well as A and B, unless expressly defined otherwise in the individual case. As an alternative wording for the same combinations, "at least one of A and B" or "A and/or B" may be used. This applies equivalently to combinations of more than two elements.

If a singular form, such as "a", "an" and "the" is used and the use of only a single element is not defined as mandatory either explicitly or implicitly, further examples may also use several elements to implement the same function. If a function is described below as implemented using multiple elements, further examples may implement the same function using a single element or a single processing entity. It is further understood that the terms "include", "including", "comprise" and/or "comprising", when used, describe the presence of the specified features, integers, steps, operations, processes, elements, components and/or a group thereof, but do not exclude the presence or addition of one or more other features, integers, steps, operations, processes, elements, components and/or a group thereof.

FIG. 1 illustrates an example of a reference buffer circuit 100 for an ADC. The reference buffer circuit 100 comprises a first input node 110 configured to receive a first bias signal 101 of a first polarity (e.g. positive polarity) from a first signal line. Further, the reference buffer circuit 100 includes a second input node 120 configured to receive a second bias signal 102 of a second polarity (e.g. negative polarity) from a second signal line. The first polarity is different from the second polarity. Additionally, the reference buffer circuit 100 includes a first output node 130 configured to output a first reference signal 103 of the first polarity. A first buffer amplifier 150 is coupled between the first input node 110 and the first output node 130. The first buffer amplifier 150 generates the first reference signal 103 based on the first bias signal 101. The reference buffer circuit 100 includes in addition a second output node 140 configured to output a second reference signal 104 of the second polarity. A second buffer amplifier 160 is coupled between the second input node 120 and the second output node 140. The second buffer amplifier 160 generates the second reference signal 104 based on the second bias signal 102.

Switching activity of an ADC coupled to the first output node 130 and the second output node 140 is affecting the first reference signal 103 and the second reference signal 104. In particular, the first buffer amplifier 150 needs to recharge the first reference signal 103 whenever the ADC is switching. Similarly, the second buffer amplifier 160 needs to recharge the second reference signal 104 whenever the ADC is switching.

The reverse isolation of the first buffer amplifier 150 is limited such that certain charge is injected from the first output node 130 to the first input node 110. This effect is called "kickback". The kickback path for the first buffer amplifier 150 is indicated by the capacitor 159 in FIG. 1. For example, the gate-source capacitance of a transistor of the first buffer amplifier 150 may cause the capacitive coupling of the first output node 130 and the first input node 110 such that a variation of the first reference signal 103 due to the ADC switching activity kicks back to the first input node 110 via the gate-source capacitance of the transistor. The feedback capacitance CFB of the capacitor 159 may, hence, substantially correspond to the gate-source capacitance of the first buffer amplifier 150's transistor.

Similarly, the reverse isolation of the second buffer amplifier 160 is limited such that certain charge is injected from the first output node 130 to the first input node 110. The kickback path for the second buffer amplifier 160 is indicated by the capacitor 169 in FIG. 1. Similarly to what is described above for the first buffer amplifier 150, a variation of the second reference signal 104 due to the ADC switching activity may kick back to the second input node 120 via the gate-source capacitance of a transistor of the second buffer amplifier 160. The feedback capacitance CFB of the capacitor 169 may, hence, substantially correspond to the gate-source capacitance of the second buffer amplifier 160's transistor.

If the first and second signal lines to which the first input node 110 and the second input 120 are respectively coupled are shared between buffer circuits of several ADCs, all of them may show transient voltage settling due to the switching activity of one of the ADCs that kicks back to the first bias signal 101 and the second bias signal 102. This unwanted crosstalk effect may negatively affect performance.

In order to neutralize the kickback through the second buffer amplifier 160, the reference buffer circuit 100 includes a first coupling path 170 comprising a first capacitive element 175 (e.g. a single capacitor or a plurality of coupled capacitors). The first coupling path 170 is coupled between the first output node 130 and the second input node 120. In addition, the reference buffer circuit 100 includes a second coupling path 180 for neutralizing the kickback through the first buffer amplifier 150. The second coupling path 180 comprises a second capacitive element 185 (e.g. a single capacitor or a plurality of coupled capacitors) and is coupled between the second output node 140 and the first input node 110.

The first reference signal 103 and the second reference signal 104 are moving in a differential manner. By capacitively coupling the output nodes 130 and 140 of the reference buffer circuit 100 to the respective input node of the opposite polarity, the respective kickback component at the input nodes 110 and 120 can be mitigated or neutralized (cancelled). In particular, the first neutralization signal fed back by the first coupling path 170 may allow to neutralize the kickback component at the second input node 120 and the second neutralization signal fed back by the second coupling path 180 may allow to neutralize the kickback component at the first input node 110.

Figure 2:
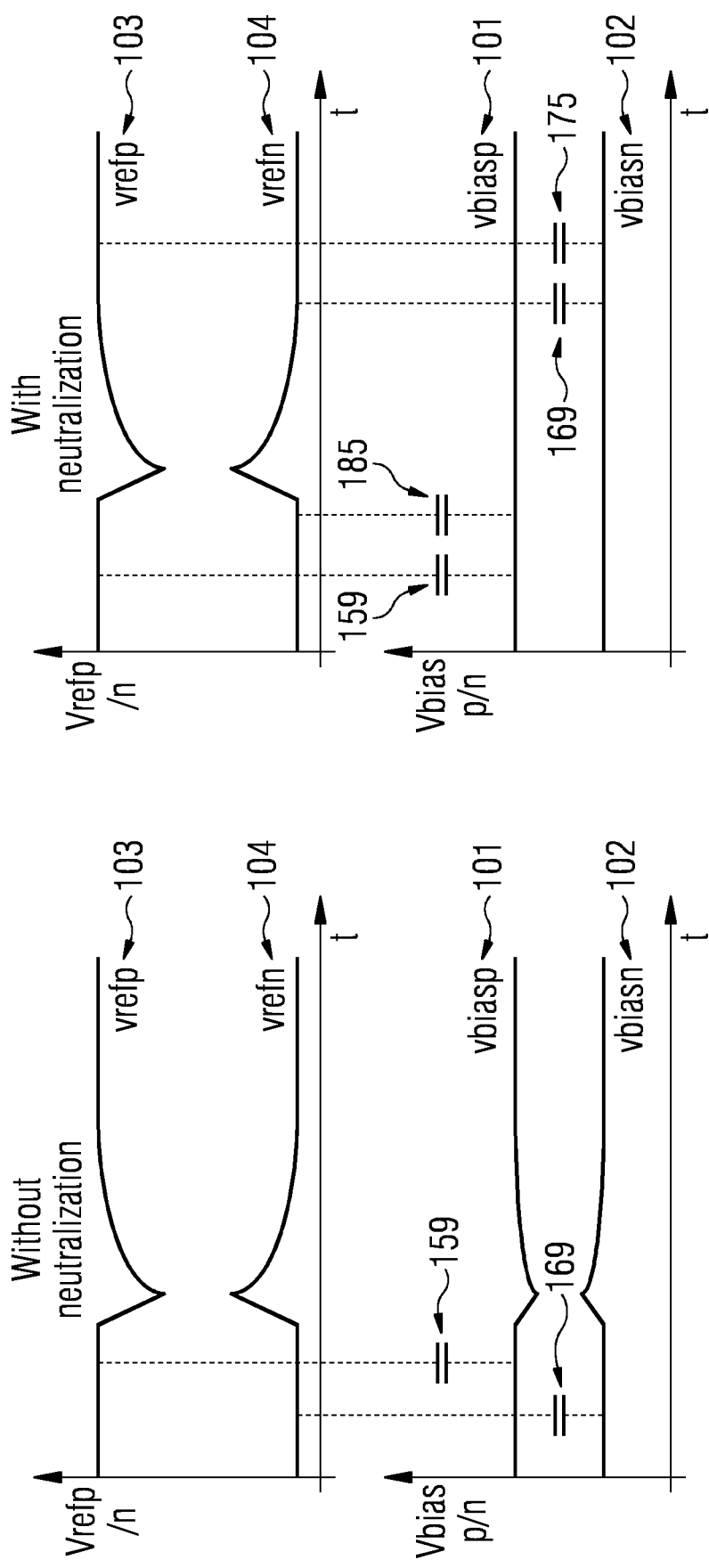
FIG. 2 illustrates a comparison of exemplary bias and reference signals.

The effect of the capacitive coupling can further be seen from FIG. 2. FIG. 2 illustrates in the upper left part exemplary courses of the first reference signal 103 and the second reference signal 104. As can be seen in the upper left part of FIG. 2, the voltages of the first reference signal 103 and the second reference signal 104 are not constant over time due to the switching activity of the ADC coupled to the first and second output nodes 130 and 140 of the reference buffer circuit 100. As the first and second output nodes 130 and 140 are capacitively coupled to the first and second input nodes 110 and 120 due to the limited reverse isolation of the first and second buffer amplifiers 150 and 160, also voltages of the first bias signal 101 and the second bias signal 102 vary over time due to the switching activity of the ADC. Exemplary courses of the first bias signal 101 and the second bias signal 102 are illustrated in the lower left part of FIG. 2. In the left part of FIG. 2, the first and second coupling paths 170 and 180 are omitted. Further, the capacitors 159 and 169 are illustrated in the left part of FIG. 2 to indicate the limited isolation between the input nodes and the output nodes of the first and second buffer amplifiers 150 and 160.

In the right part of FIG. 2, the first and second coupling paths 170 and 180 are present. This is illustrated by the capacitors 175 and 185 that couple the output nodes 130 and 140 of the reference buffer circuit to the respective input node of the opposite polarity. As a result, the fed back variation of the first reference signal 103 due to the ADC switching activity neutralizes the kickback through the second buffer amplifier 160 such that the first bias signal 101 remains constant over time, i.e. the first bias signal 101 is not affected by the ADC switching activity. Analogously, the fed back variation of the second reference signal 104 due to the ADC switching activity neutralizes the kickback through the first buffer amplifier 150 such that the second bias signal 102 remains constant over time, i.e. the second bias signal 102 is not affected by the ADC switching activity.

The capacitances of the first capacitive element 175 and the second capacitive element 185 may be similar to the gate-source capacitances of the transistors of the first buffer amplifier 150 and the second buffer amplifier 160 as the kickback effect may be mainly caused by the gate-source capacitances of the transistors of the buffer amplifiers. For example, a respective capacitance of at least one of the first capacitive element 175 and the second capacitive element 185 may be at minimum 50% and at maximum 150% of a gate-source capacitance of any transistor of the first buffer amplifier 150 and/or the second buffer amplifier 160.

The capacitance of the first capacitive element 175 may be equal to the capacitance of the second capacitive element 185 according to some examples. In other examples, the capacitance of the first capacitive element 175 may be different from the capacitance of the second capacitive element 185.

In other examples, the first and second coupling paths 170 and 180 may comprise additional elements. For example, the first coupling path 170 may additionally comprise at least one of first resistive element (e.g. a single resistor or a plurality of coupled resistor) and a first inductive element (e.g. a single inductor or a plurality of coupled inductor). Similarly, the second coupling path 180 may additionally comprise at least one of second resistive element (e.g. a single resistor or a plurality of coupled resistor) and a second inductive element (e.g. a single inductor or a plurality of coupled inductor). Accordingly, more complex cancellation networks may be formed in at least one of the first and second coupling paths 170 and 180. The cancellation networks may be matched in terms of magnitude and phase of the neutralization signals fed back by the first and second coupling paths 170 and 180.

In the following further reference buffer circuits will be described with reference to FIGS. 3 to 7 for highlighting further details of the proposed technology.

Figure 3:
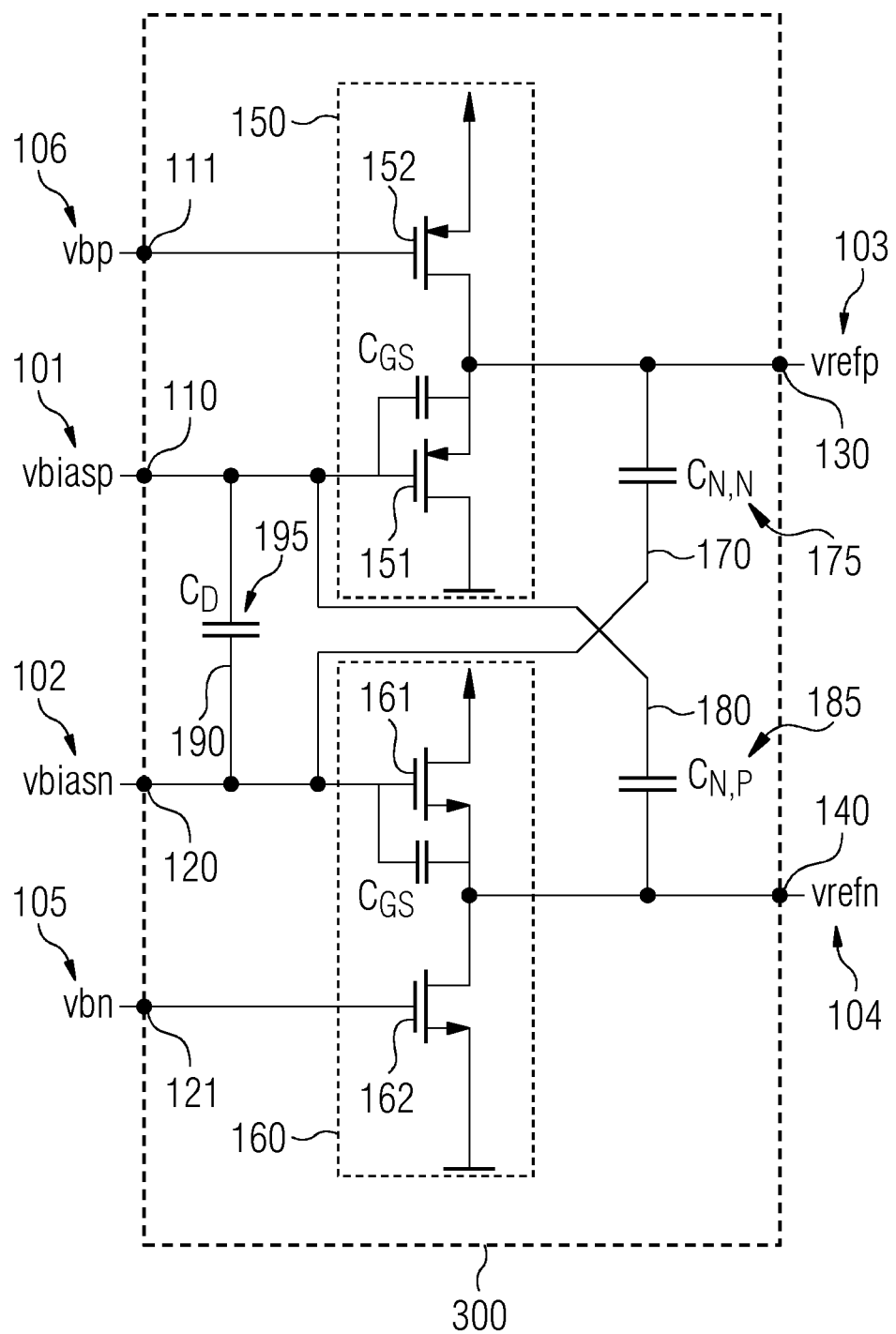
FIG. 3 illustrates a second example of a reference buffer circuit.

FIG. 3 illustrates a reference buffer circuit 300. The basic structure of the reference buffer circuit 300 is identical to the one of the reference circuit 100 described above. Supplementary to FIG. 1, FIG. 3 illustrates further details of the first amplifier buffer 150 and the second amplifier buffer 160.

In the example of FIG. 3, the first amplifier buffer 150 and the second amplifier buffer 160 are both source follower circuits.

The first amplifier buffer 150 comprises a first transistor 151 and a second transistor 152 coupled in series between (a node configured to receive) a first electrical (e.g. a positive supply voltage $V_{DD}$) and (a node configured to receive) a second electrical potential (e.g. a negative supply voltage $V_{SS}$ or ground). A gate terminal of the first transistor 151 is coupled to the first input node 110 such that a conductivity of the first transistor 151 is controlled based on the first bias voltage 101. A gate terminal of the second transistor 152 is coupled to a third input node 111 of the reference buffer circuit 300. The third input node 111 is configured to receive a first constant signal 106 (e.g. an enable signal or a bias voltage) such that the second transistor 152 is kept in a conductive state. The first output node 130 is coupled to a source terminal of the first transistor 151.

Similarly, the second amplifier buffer 160 comprises a third transistor 161 and a fourth transistor 162 coupled in series between (another node configured to receive) the first electrical and (another node configured to receive) the second electrical potential. A gate terminal of the third transistor 161 is coupled to the second input node 120 such that a conductivity of the third transistor 161 is controlled based on the second bias voltage 102. A gate terminal of the fourth transistor 162 is coupled to a fourth input node 121 of the reference buffer circuit 300. The fourth input node 121 is configured to receive a second constant signal 105 (e.g. an enable signal or a bias voltage) such that the fourth transistor 162 is kept in a conductive state. The second output node 140 is coupled to a source terminal of the third transistor 161.

The transistor 151 and 152 of the first buffer amplifier 150 are of a first conductivity type, namely the transistor 151 and 152 are p-type (p-channel) transistors. The transistor 161 and 162 of the second buffer amplifier 160 are of a different second conductivity type, namely the transistor 161 and 162 are n-type (n-channel) transistors.

In the differential source follower reference buffer configuration illustrated in FIG. 3, both signal polarities of the reference signals (voltages) are available at the output nodes 130 and 140 and are moving in differential manner. Similar to what is described above, a respective capacitance 175, 185 coupled to the input node of the other polarity can be used to cancel the kickback effect. Since the main kickback effect to the common bias nodes are the gate-source-capacitances of the transistors 151 and 161, a capacitance of similar size may be used for the capacitors 175 and 185.

In comparison to the reference buffer circuit 100, the reference buffer circuit 300 comprises a third coupling path 190. The third coupling path 190 comprises a third capacitive element 195 (e.g. a single capacitor or a plurality of coupled capacitors) and is coupled between the first input node 110 and the second input node 120.

The third capacitive element 195 between the first input node 110 and the second input node 120 is an additional blocking capacitance to keep the first input node 110 and the second input node 120 quiet. Compared to conventional architectures, a capacitance of the third capacitive element 195 may be significantly reduced due to the first and second capacitive elements 175 and 185 in the first and second coupling paths 170 and 180. In other examples such as the reference buffer circuit 100, the third capacitive element 195 may be omitted due to the first and second capacitive elements 175 and 185 in the first and second coupling paths 170 and 180.

The capacitance of the third capacitive element 195 may, e.g., be equal to or greater than the gate-source capacitance of any transistor of the first buffer amplifier 150 and/or the second buffer amplifier 160.

Figure 4:
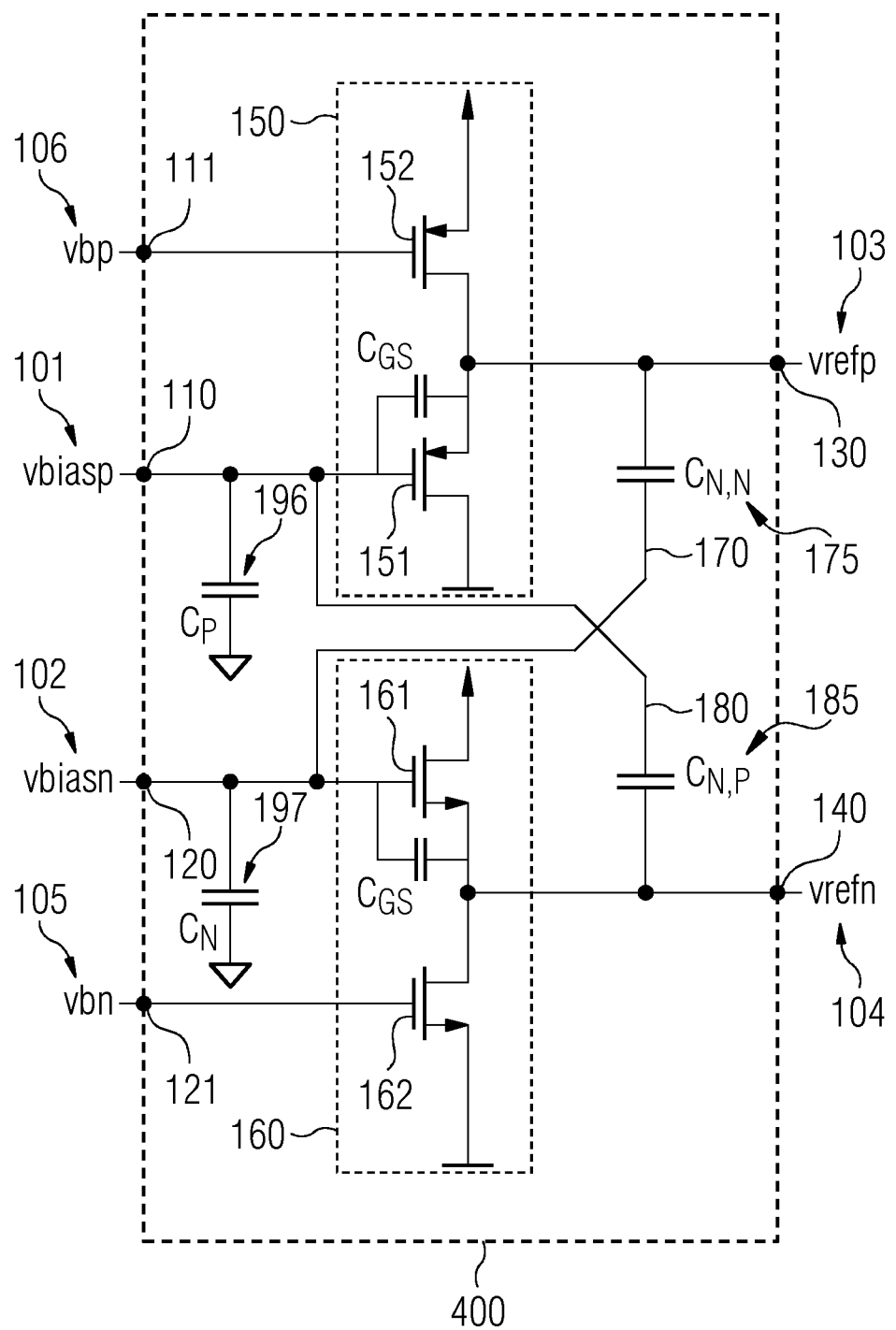
FIG. 4 illustrates a third example of a reference buffer circuit.

FIG. 4 illustrates another reference buffer circuit 400. While the reference buffer circuit 300 comprises the third coupling path 190, the reference buffer circuit 400 instead comprises a fourth capacitive element 196 and a fifth capacitive element 197. The fourth capacitive element 196 is coupled between the first input node 110 and a ground node coupled to ground.

Similarly, the fifth capacitive element 197 is coupled between the second input node 120 and another ground node coupled to ground. Other than that, the reference buffer circuit 400 is identical to the reference buffer circuit 300.

Using the fourth capacitive element 196 and a fifth capacitive element 197 is an alternative to the third coupling path 190 for keeping the first input node 110 and the second input node 120 quiet.

The capacitance of the third capacitive element 196 may, e.g., be equal to or greater than the gate-source capacitance of any transistor of the first buffer amplifier 150 and/or the second buffer amplifier 160. Similarly, the capacitance of the fourth capacitive element 197 may, e.g., be equal to or greater than the gate-source capacitance of any transistor of the first buffer amplifier 150 and/or the second buffer amplifier 160.

Figure 5:
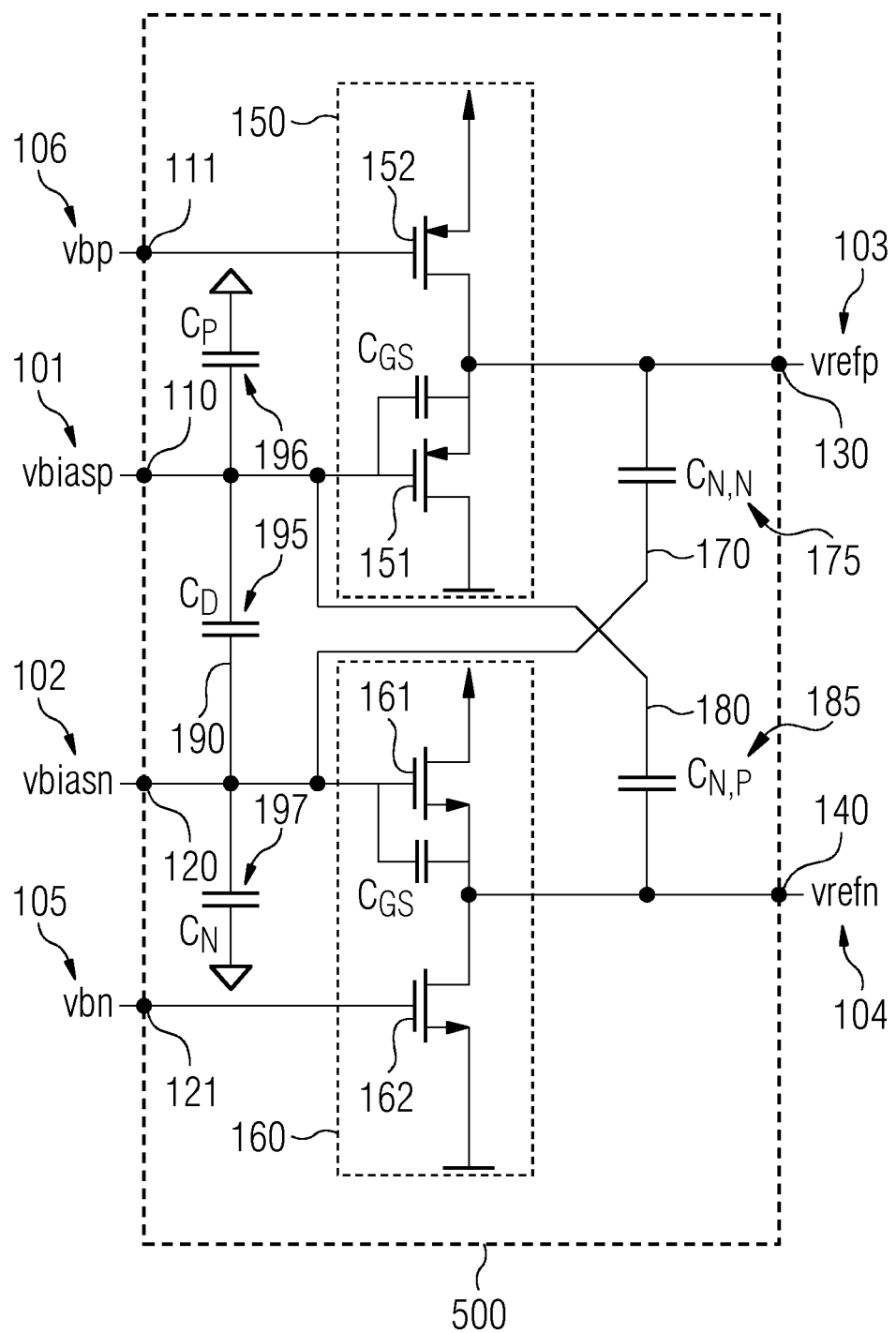
FIG. 5 illustrates a fourth example of a reference buffer circuit.

FIG. 5 illustrates a further reference buffer circuit 500 which is a combination of the reference buffer circuit 300 and the reference buffer circuit 400. The reference buffer circuit 500 comprises the third coupling path 190 coupled between the first input node 110 and the second input node 120. Similar to what is described above, the third coupling path 190 comprises the third capacitive element 195. Additionally, the reference buffer circuit 500 comprises the fourth capacitive element 196 and the fifth capacitive element 197. The fourth capacitive element 196 is coupled between the first input node 110 and a ground node coupled to ground. Similarly, the fifth capacitive element 197 is coupled between the second input node 120 and another ground node coupled to ground.

The third capacitive element 195, the fourth capacitive element 196 and the fifth capacitive element 197 allow to keep the first input node 110 and the second input node 120 quiet.

Figure 6:
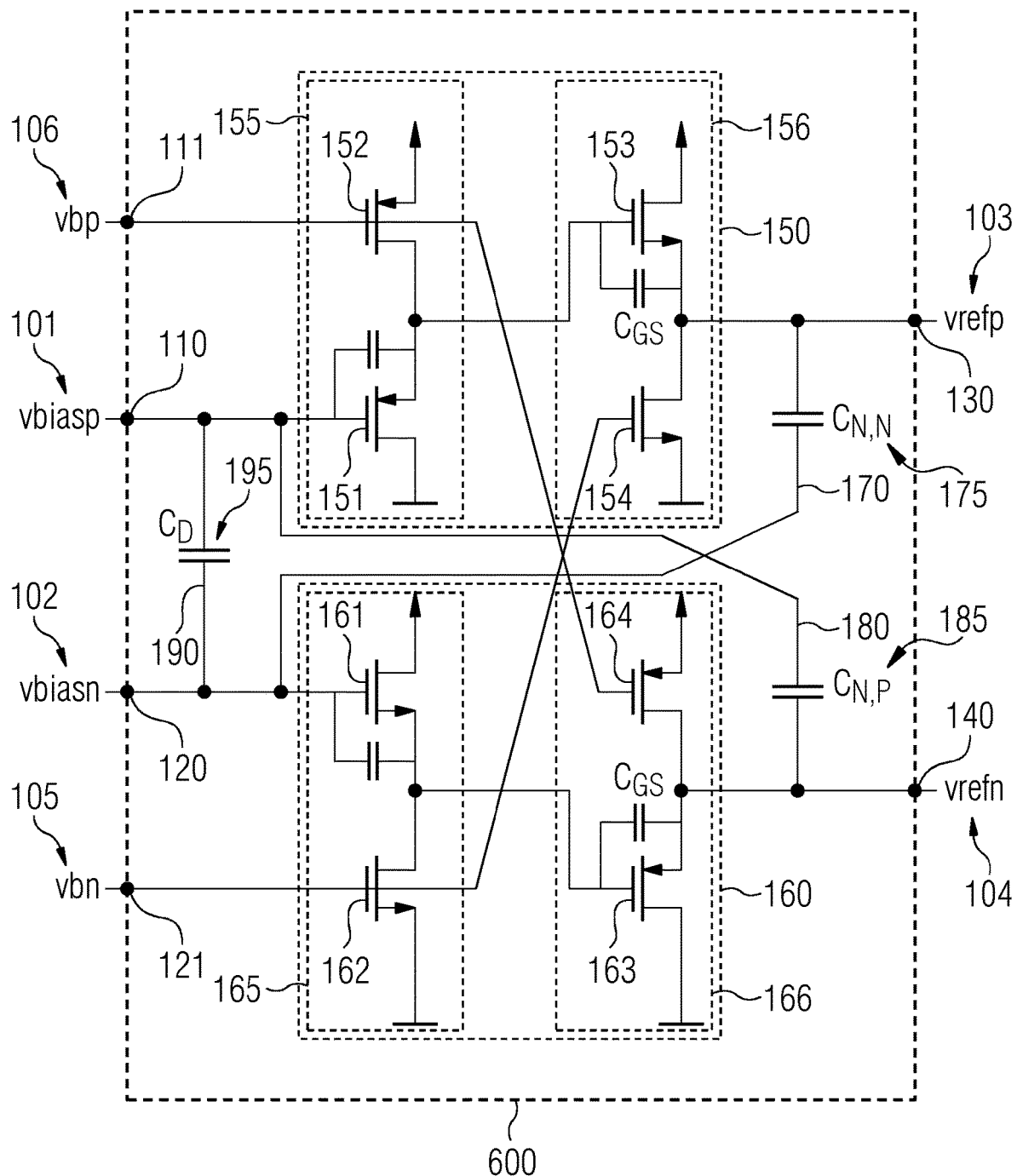
FIG. 6 illustrates a fifth example of a reference buffer circuit.

FIG. 6 illustrates a reference buffer circuit 600 in which the first amplifier buffer 150 and the second amplifier buffer 160 are respectively formed by cascaded source follower circuits.

The first buffer amplifier 150 comprises a first source follower circuit 155 and a second source follower circuit 156 coupled in series. Similarly, the second buffer amplifier 160 comprises a third source follower circuit 165 and a fourth source follower circuit 166 coupled in series.

Cascading the source follower circuits in the buffer amplifiers 150 and 160 respectively improves the reverse isolation of the buffer amplifiers 150 and 160 such that the capacitances of the first capacitive element 175 and the second capacitive element 185 may be reduced compared to the above examples so as to increase the respective impedance of the coupling paths 170 and 180.

The first source follower circuit 155 comprises a first transistor 151 and a second transistor 152 coupled in series between (a node configured to receive) a first electrical (e.g. a positive supply voltage $V_{DD}$) and (a node configured to receive) a second electrical potential (e.g. a negative supply voltage $V_{SS}$ or ground). A gate terminal of the first transistor 151 is coupled to the first input node 110 such that a conductivity of the first transistor 151 is controlled based on the first bias voltage 101. A gate terminal of the second transistor 152 is coupled to a third input node 111 of the reference buffer circuit 600. The third input node 111 is configured to receive a first constant signal 106 (e.g. an enable signal or a bias voltage) such that the second transistor 152 is kept in a conductive state.

The second source follower circuit 156 comprises a third transistor 153 and a fourth transistor 154 coupled in series between (another node configured to receive) the first electrical and (another node configured to receive) the second electrical potential. A gate terminal of the third transistor 153 is coupled to a source terminal of the first transistor 151. The first output node 130 is coupled to a source terminal of the third transistor 153.

The third source follower circuit 165 comprises a fifth transistor 161 and a sixth transistor 162 coupled in series between (a further node configured to receive) the first electrical and (a further node configured to receive) the second electrical potential. A gate terminal of the fifth transistor 161 is coupled to the second input node 120 such that a conductivity of the fifth transistor 161 is controlled based on the second bias voltage 102. A gate terminal of the sixth transistor 162 is coupled to a fourth input node 121 of the reference buffer circuit 600.

The fourth input node 121 is configured to receive a second constant signal 105 (e.g. an enable signal or a bias voltage) such that the sixth transistor 162 is kept in a conductive state.

The fourth source follower circuit 166 comprises a seventh transistor 163 and an eighth transistor 164 coupled in series between (a still further node configured to receive) the first electrical and (a still further node configured to receive) the second electrical potential. A gate terminal of the seventh transistor 163 is coupled to a source terminal of the fifth transistary 161. The second output node 140 is coupled to a source terminal of the seventh transistor 163.

A gate terminal of the fourth transistor 154 is coupled to the fourth input node 121 such that the fourth transistor 154 is kept in a conductive state. Similarly, a gate terminal of the eighth transistor 164 is coupled to the third input node 111 such that the eighth transistor 164 is kept in a conductive state.

The transistors 151 and 152 of the first source follower circuit 155 as well as the transistor 163 and 164 of the fourth source follower circuit 166 are of a first conductivity type, namely the transistor 151, 152, 163 and 164 of are p-type (p-channel) transistors. The transistors 153 and 154 of the second source follower circuit 156 as well as the transistors 161 and 162 of the third source follower circuit 165 are of a different second conductivity type, namely the transistor 153, 154, 161 and 162 are n-type (n-channel) transistors.

Similar to what is described above, the third coupling path 190 and the third capacitive element 195 may optionally be omitted.

Figure 7:
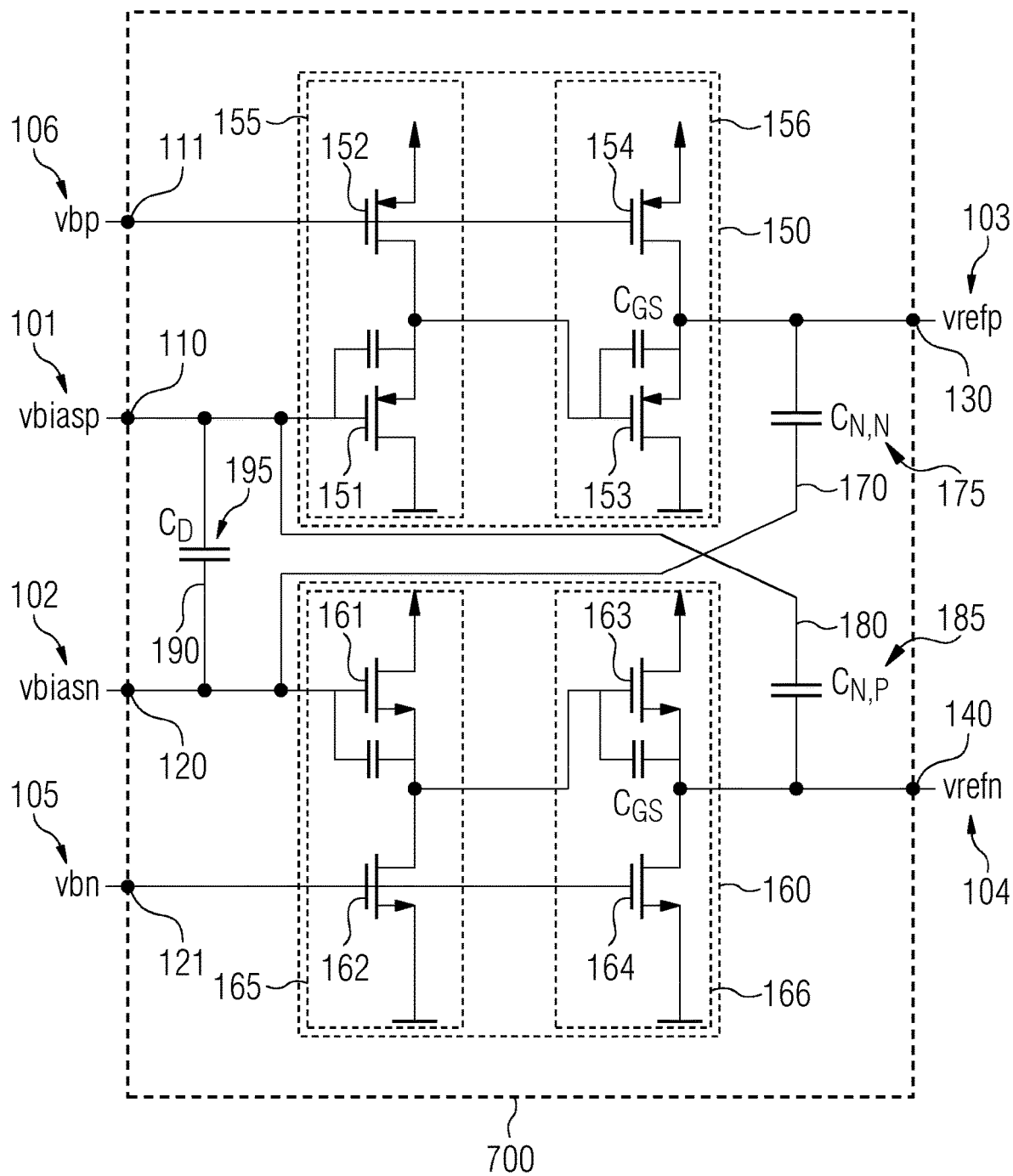
FIG. 7 illustrates a sixth example of a reference buffer circuit.

FIG. 7 illustrates another reference buffer circuit 700 in which the first amplifier buffer 150 and the second amplifier buffer 160 are respectively formed by cascaded source follower circuits.

Similarly to what is described above for the reference buffer circuit 600, cascading the source follower circuits in the buffer amplifiers 150 and 160 respectively improves the reverse isolation of the buffer amplifiers 150 and 160 such that the capacitances of the first capacitive element 175 and the second capacitive element 185 may be reduced.

The first buffer amplifier 150 comprises a first source follower circuit 155 and a second source follower circuit 156 coupled in series. Similarly, the second buffer amplifier 160 comprises a third source follower circuit 165 and a fourth source follower circuit 166 coupled in series. The first source follower circuit 155 and the third source follower circuit 165 are identical to those of the reference buffer circuit 600. However, the second source follower circuit 156 and the fourth source follower circuit 166 are different from those of the reference buffer circuit 600.

The second source follower circuit 156 comprises a third transistor 153 and a fourth transistor 154 coupled in series between (a node configured to receive) the first electrical and (a node configured to receive) the second electrical potential. A gate terminal of the third transistor 153 is coupled to a source terminal of the first transistor 151. A gate terminal of the fourth transistor 154 is coupled to the third input node 111 such that the fourth transistor 154 is kept in a conductive state. The first output node 130 is again coupled to a source terminal of the third transistor 153.

The fourth source follower circuit 166 comprises a seventh transistor 163 and an eighth transistor 164 coupled in series between (another node configured to receive) the first electrical and (another node configured to receive) the second electrical potential. A gate terminal of the seventh transistor 163 is coupled to a source terminal of the fifth transistor 161. A gate terminal of the eighth transistor 164 is coupled to the fourth input node 121 such that the eighth transistor 164 is kept in a conductive state. The second output node 140 is again coupled to a source terminal of the seventh transistor 163.

In the example of FIG. 7, the transistors 151 and 152 of the first source follower circuit 155 as well as the transistors 153 and 154 of the second source follower circuit 156 are of the same first conductivity type, namely the transistor 151, 152, 153 and 154 of are p-type (p-channel) transistors. Similarly, the transistors 161 and 162 of the third source follower circuit 165 as well as the transistors 163 and 164 of the fourth source follower circuit 166 are of the same second conductivity type, namely the transistor 161, 162, 163 and 164 of are n-type (n-channel) transistors.

In other words, source follower circuits of the same polarity are respectively are used in the buffer amplifiers 150 and 160 of the reference buffer circuit 700. In comparison, source follower circuits of different polarities are respectively are used in the buffer amplifiers 150 and 160 of the reference buffer circuit 600.

Figure 8:
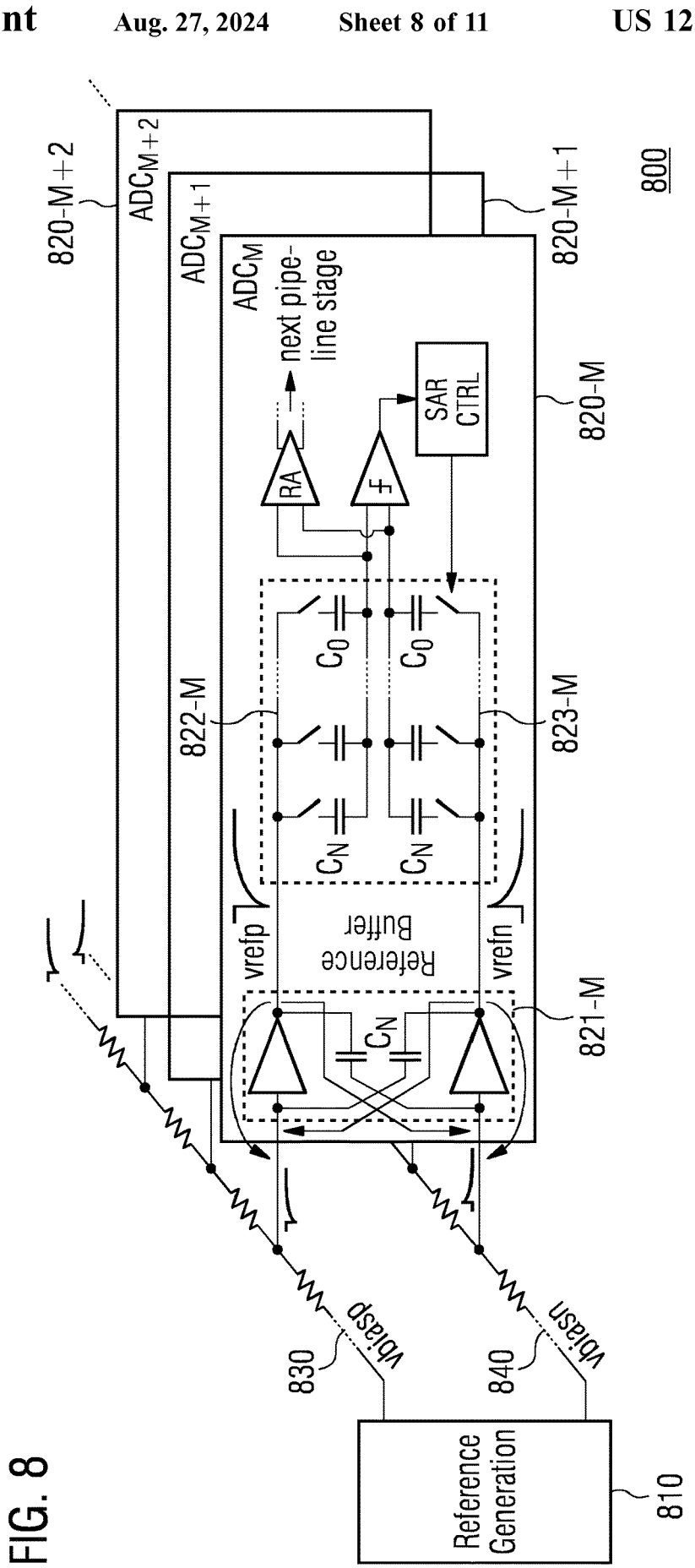
FIG. 8 illustrates an example of an ADC system.

FIG. 8 illustrates an example of an ADC system 800 that uses a reference buffer circuit according to the present disclosure.

The ADC system 800 comprises plurality of sub-ADCs 820-M, 820-M+1, 820-M+2, . . . for digitizing an analog input signal. In the example of FIG. 8, the plurality of sub-ADCs 820-M, 820-M+1, 820-M+2, . . . are Successive-Approximation Register (SAR) ADCs which are time-interleaved. However, it is to be noted that the present disclosure is not limited thereto. In general, any ADC technology may be used for the plurality of sub-ADCs 820-M, 820-M+1, 820-M+2, . . . , not only SAR ADC technology. Similarly, the plurality of sub-ADCs 820-M, 820-M+1, 820-M+2, . . . need not be time-interleaved. The plurality of sub-ADCs may, e.g., be pipelined instead.

The ADC system 800 further comprises a biasing circuit 810 configured to supply a first bias signal of a first polarity (vbiasp exhibiting positive polarity) to a first signal line 830 and a second bias signal of a second polarity (vbiasn exhibiting negative polarity) to a second signal line 840.

The plurality of sub-ADCs 820-M, 820-M+1, 820-M+2, . . . are all coupled to the first signal line 830 and the second signal line 840 for receiving the first bias signal and the second bias signal.

The sub-ADC 820-M comprises a reference buffer circuit 821-M according to one or more aspects of the architecture described above in connection with FIGS. 1 to 7 or one more examples described above in connection with FIGS. 1 to 7 for coupling the sub-ADC 820-M to the first signal line 830 and the second signal line 840. Similarly, the other sub-ADCs 820-M+1, 820-M+2, . . . may comprise a respective buffer circuit according to the present disclosure for coupling the respective sub-ADC to the first signal line 830 and the second signal line 840.

The sub-ADC 820-M comprises a first plurality of switches 822-M for selectively coupling a first plurality of loads (here the sampling capacitors Co, . . . CN) to the first output node of the reference buffer circuit 821-M. Further, the sub-ADC 820-M comprises a second plurality of switches 823-M for selectively coupling a second plurality of loads (here the sampling capacitors Co, . . . CN) to the second output node of the reference buffer circuit 821-M.

The switching activity of the switched loads/capacitors affects the reference signals output by the reference buffer circuit 821-M. In particular, the first buffer amplifier 150 needs to recharge the reference signals whenever the loads/capacitors are switched. By capacitively coupling the output nodes of the reference buffer circuit 821-M to the respective input node of the opposite polarity, the respective kickback component at the input nodes of the reference buffer circuit 821-M can be mitigated or neutralized (cancelled).

The kickback neutralization allows to significantly reduce crosstalk from the sub-ADC 820-M to the other sub-ADCs 820-M+1, 820-M+2, . . . and allows to design the bias circuit 810 as well as the signal lines 830 and 840 with higher impedance levels, which may allow a more power and area efficient implementation.

The other sub-ADCs 820-M+1, 820-M+2, . . . may be implemented analogously to the above described sub-ADC 820-M.

Figure 9:
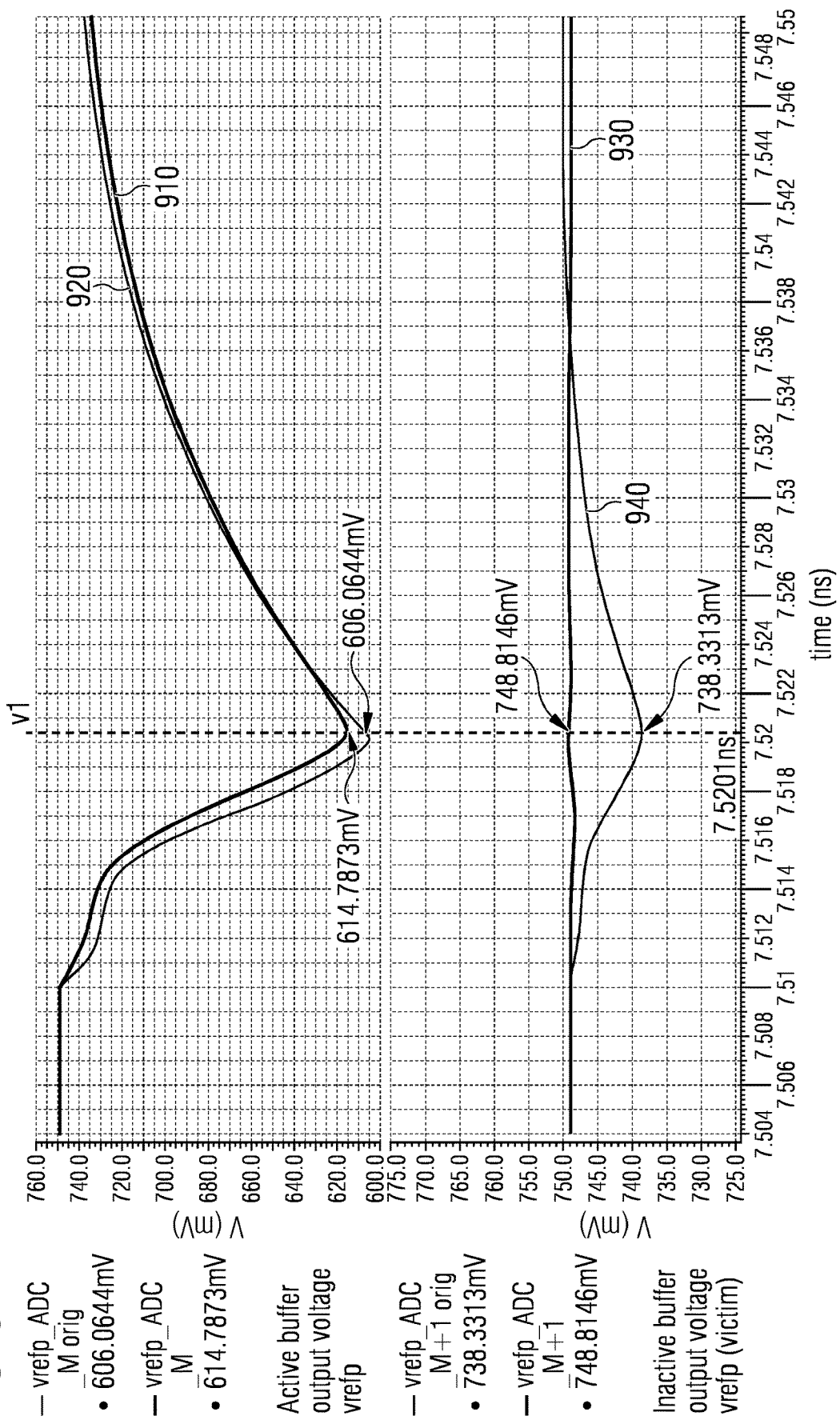
FIG. 9 illustrates a first exemplary comparison of reference voltages output by two buffer circuits.
Figure 10:
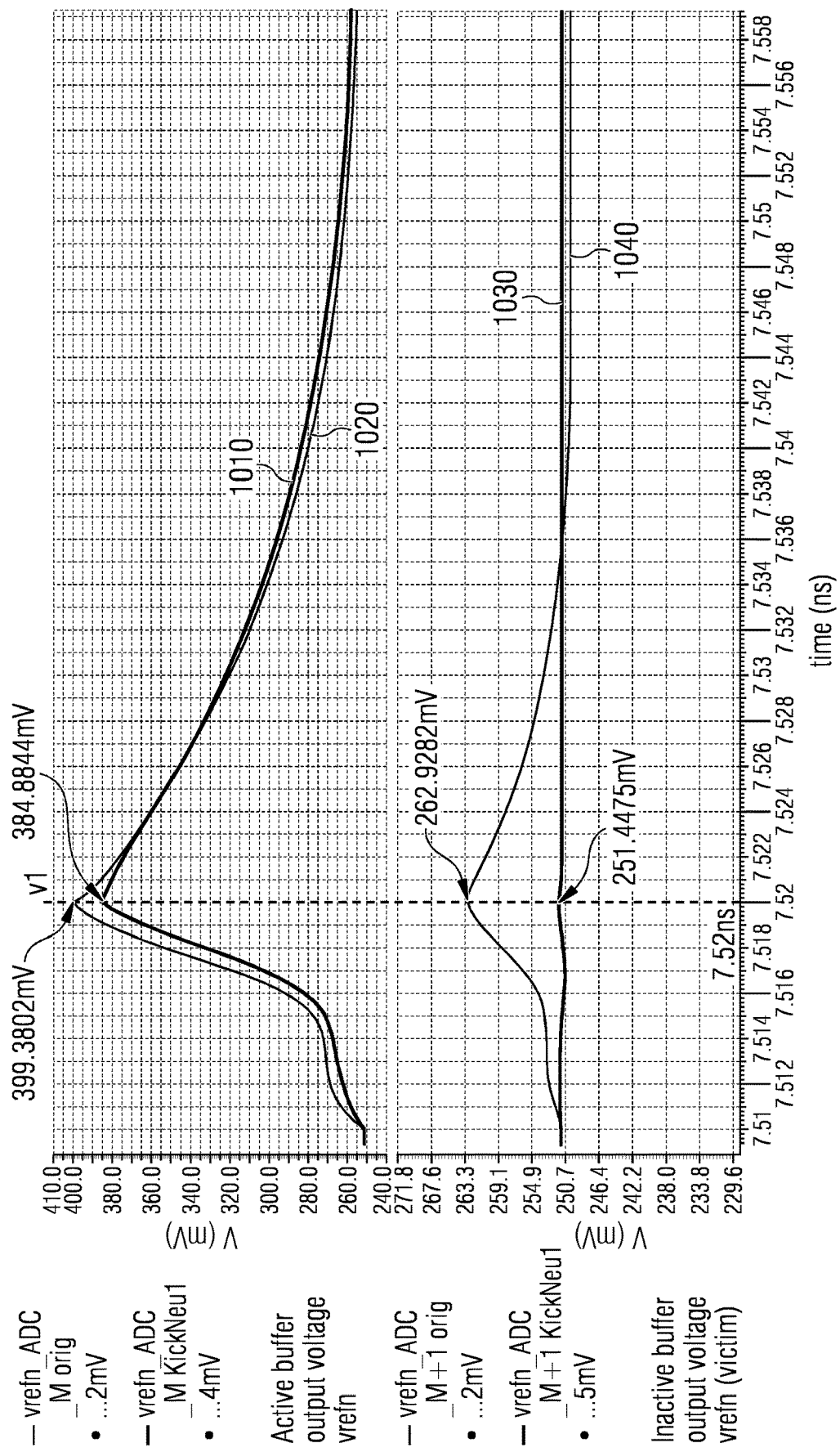
FIG. 10 illustrates a second exemplary comparison of reference voltages output by two buffer circuits.

An effect of the proposed kickback neutralization on buffers coupled to common bias lines can be seen in FIGS. 9 and 10. FIG. 9 illustrates in the upper part the temporal course of a reference signal 910 of positive polarity output by a reference buffer circuit according to the present disclosure. An ADC is coupled to the reference buffer circuit according to the present disclosure. The ADC performs a switching operation which causes the voltage of the reference signal 910 to vary over time. Hence, the reference buffer circuit according to the present disclosure may be understood as an active buffer. The reference buffer circuit according to the present disclosure is coupled to a common first bias line for receiving a bias signal of positive polarity. In the lower part of FIG. 9, a temporal course of a reference signal 930 of positive polarity output by another reference buffer coupled to the common first bias line is illustrated. Another ADC is coupled to the other reference buffer; however the other ADC is not performing a switching operation. Hence, the other reference buffer may be understood as an inactive buffer. As can be seen from FIG. 9, the temporal course of the reference signal 930 is hardly affected by the switching operation of the ADC.

For comparison, FIG. 9 illustrates the temporal courses in case a conventional buffer circuit is coupled to the ADC instead of the reference buffer circuit according to the present disclosure. The temporal course of the reference signal 920 of positive polarity output by the conventional buffer circuit is similar to the temporal course of the reference signal 910 of positive polarity output by a reference buffer circuit according to the present disclosure. However, in this case, the temporal course of the reference signal 940 of positive polarity output by the inactive buffer shows a significant voltage variation.

FIG. 10 illustrates the equivalent situation for the reference signals of negative polarity. For the active buffers, the temporal course of the reference signal 1010 of negative polarity output by a reference buffer circuit according to the present disclosure is again similar to the temporal course of the reference signal 1020 of negative polarity output by a conventional buffer circuit. In case the reference buffer circuit according to the present disclosure is used with the actively switching ADC, the temporal course of the reference signal 1030 of negative polarity output by the inactive buffer is hardly affected by the switching operation of the ADC similar to the situation illustrated in FIG. 9. Further, the temporal course of the reference signal 1040 of negative polarity output by the inactive buffer shows a significant voltage variation in case the conventional buffer circuit is used with the actively switching ADC.

Figure 11:
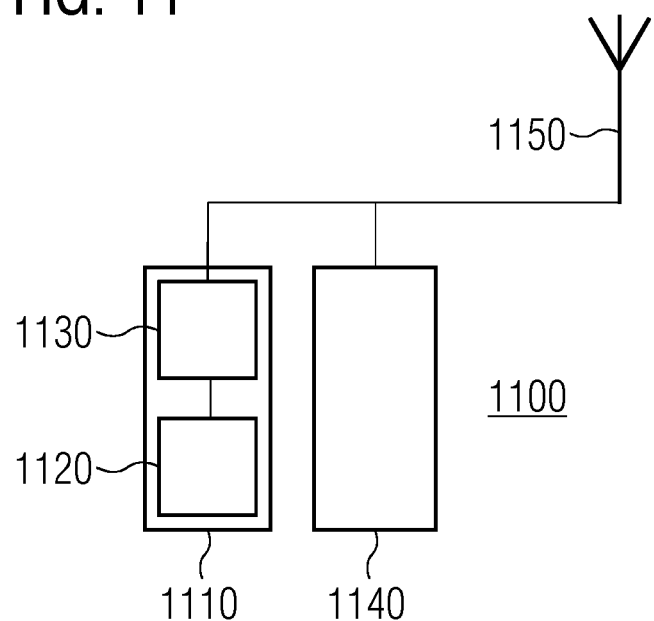
FIG. 11 illustrates an example of a base station.

An example of an implementation using reference buffering according to one or more aspects of the architecture described above in connection with FIGS. 1 to 8 or one or more examples described above in connection with FIGS. 1 to 8 is illustrated in FIG. 11. FIG. 11 schematically illustrates an example of a radio base station 1100 (e.g. for a femtocell, a picocell, a microcell or a macrocell) comprising an ADC system 1120 as proposed.

A receiver 1110 of the base station 1100 comprises the ADC system 1120. The receiver 1110 additionally comprises analog circuitry 1130 configured to receive an RF receive signal from at least one antenna element 1150 of the base station 1100. The analog circuitry 1130 is further configured to supply an analog input signal to the ADC system 1120 based on the RF receive signal. The ADC system 1120 generates a digital receive signal based on the analog input signal. For example, the analog circuitry 1130 may be an analog RF front-end and comprising one or more of a filter, a down-conversion mixer, ElectroStatic Discharge (ESD) protection circuitry, an attenuator etc.

Further, the base station 1100 comprises a transmitter 1140 configured to generate an RF transmit signal. The transmitter 1140 may use the antenna element 1150 or another antenna element (not illustrated) of the base station 1100 for radiating the RF transmit signal to the environment.

To this end, a base station with improved analog-to-digital conversion capabilities may be provided.

The base station 1100 may comprise further elements such as, e.g., an application processor, memory, a network controller, a user interface, power management circuitry, a satellite navigation receiver, a network interface controller or power tee circuitry.

In some aspects, the application processor may include one or more Central Processing Unit CPU cores and one or more of cache memory, a Low-DropOut (LDO) voltage regulator, interrupt controllers, serial interfaces such as Serial Peripheral Interface (SPI), InterIntegrated Circuit ($I^2C$) or universal programmable serial interface module, Real Time Clock (RTC), timer-counters including interval and watchdog timers, general purpose Input-Output (IO), memory card controllers such as Secure Digital (SD)/MultiMedia Card (MMC) or similar, Universal Serial Bus (USB) interfaces, Mobile Industry Processor Interface Alliance (MIPI) interfaces and Joint Test Access Group (JTAG) test access ports.

In some aspects, the baseband processor may be implemented, for example, as a solder-down substrate including one or more integrated circuits, a single packaged integrated circuit soldered to a main circuit board or a multi-chip module containing two or more integrated circuits.

In some aspects, the memory may include one or more of volatile memory including Dynamic Random Access Memory (DRAM) and/or Synchronous Dynamic Random Access Memory (SDRAM), and Non-Volatile Memory (NVM) including high-speed electrically erasable memory (commonly referred to as Flash memory), Phase change Random Access Memory (PRAM), Magnetoresistive Random Access Memory (MRAM) and/or a three-dimensional crosspoint (3D XPoint) memory. The memory may be implemented as one or more of solder down packaged integrated circuits, socketed memory modules and plug-in memory cards.

In some aspects, the power management integrated circuitry may include one or more of voltage regulators, surge protectors, power alarm detection circuitry and one or more back-up power sources such as a battery or capacitor. Power alarm detection circuitry may detect one or more of brown out (under-voltage) and surge (over-voltage) conditions.

In some aspects, the power tee circuitry may provide for electrical power drawn from a network cable to provide both power supply and data connectivity to the base station using a single cable.

In some aspects, the network controller may provide connectivity to a network using a standard network interface protocol such as Ethernet. Network connectivity may be provided using a physical connection which is one of electrical (commonly referred to as copper interconnect), optical or wireless.

In some aspects, the satellite navigation receiver module may include circuitry to receive and decode signals transmitted by one or more navigation satellite constellations such as the Global Positioning System (GPS), GLObalnaya NAvigatSionnaya Sputnikovaya Sistema (GLONASS), Galileo and/or BeiDou. The receiver may provide data to the application processor which may include one or more of position data or time data. The application processor may use time data to synchronize operations with other radio base stations.

In some aspects, the user interface may include one or more of physical or virtual buttons, such as a reset button, one or more indicators such as Light Emitting Diodes (LEDs) and a display screen.

Figure 12:
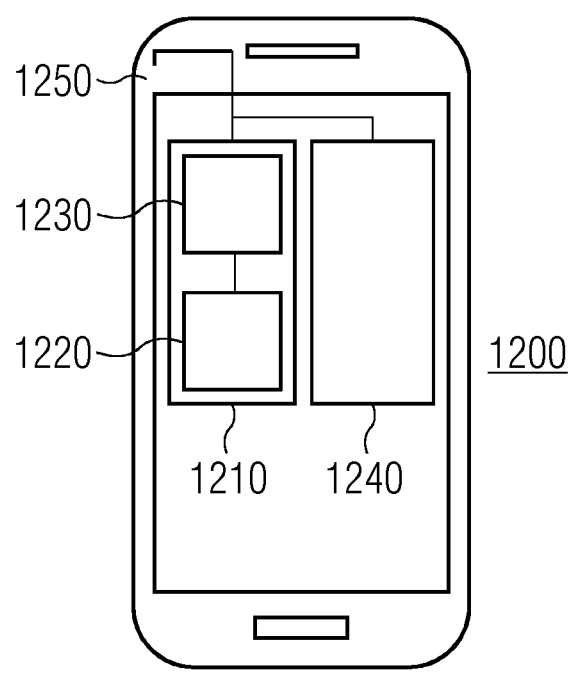
FIG. 12 illustrates an example of a mobile device.

Another example of an implementation using reference buffering according to one or more aspects of the architecture described above in connection with FIGS. 1 to 8 or one or more examples described above in connection with FIGS. 1 to 8 is illustrated in FIG. 12. FIG. 12 schematically illustrates an example of a mobile device 1200 (e.g. mobile phone, smartphone, tablet-computer, or laptop) comprising an ADC system 1220 as proposed.

A receiver 1210 of the mobile device 1200 comprises the ADC system 1220. The receiver 1210 additionally comprises analog circuitry 1230 configured to receive an RF receive signal from at least one antenna element 1250 of the mobile device 1200. The analog circuitry 1230 is further configured to supply an analog input signal to the ADC system 1220 based on the RF receive signal. The ADC system 1220 generates a digital receive signal based on the analog input signal. For example, the analog circuitry 1230 may be an analog RF front-end and comprise one or more of a filter, a down-conversion mixer, ESD protection circuitry, an attenuator etc.

Further, the mobile device 1200 comprises a transmitter 1240 configured to generate an RF transmit signal. The transmitter 1240 may use the antenna element 1250 or another antenna element (not illustrated) of the mobile device 1200 for radiating the RF transmit signal to the environment.

To this end, a mobile device with improved analog-to-digital conversion capabilities may be provided.

The mobile device 1200 may comprise further elements such as, e.g., a baseband processor, memory, a connectivity module, a Near Field Communication (NFC) controller, an audio driver, a camera driver, a touch screen, a display driver, sensors, removable memory, a power management integrated circuit or a smart battery.

In some aspects, the application processor may include, for example, one or more CPU cores and one or more of cache memory, LDO regulators, interrupt controllers, serial interfaces such as SPI, I²C or universal programmable serial interface module, RTC, timer-counters including interval and watchdog timers, general purpose input-output (IO), memory card controllers such as SD/MMC or similar, USB interfaces, MIPI interfaces and JTAG test access ports.

In some aspects, the baseband module may be implemented, for example, as a solder-down substrate including one or more integrated circuits, a single packaged integrated circuit soldered to a main circuit board, and/or a multi-chip module containing two or more integrated circuits.

The wireless communication circuits using reference buffering according to the proposed architecture or one or more of the examples described above may be configured to operate according to one of the 3rd Generation Partnership Project (3GPP)-standardized mobile communication networks or systems. The mobile or wireless communication system may correspond to, for example, a 5$^{th}$ Generation New Radio (5G NR), a Long-Term Evolution (LTE), an LTE-Advanced (LTE-A), High Speed Packet Access (HSPA), a Universal Mobile Telecommunication System (UMTS) or a UMTS Terrestrial Radio Access Network (UTRAN), an evolved-UTRAN (e-UTRAN), a Global System for Mobile communication (GSM), an Enhanced Data rates for GSM Evolution (EDGE) network, or a GSM/EDGE Radio Access Network (GERAN). Alternatively, the wireless communication circuits may be configured to operate according to mobile communication networks with different standards, for example, a Worldwide Inter-operability for Microwave Access (WIMAX) network IEEE 802.16 or Wireless Local Area Network (WLAN) IEEE 802.11, generally an Orthogonal Frequency Division Multiple Access (OFDMA) network, a Time Division Multiple Access (TDMA) network, a Code Division Multiple Access (CDMA) network, a Wideband-CDMA (WCDMA) network, a Frequency Division Multiple Access (FDMA) network, a Spatial Division Multiple Access (SDMA) network, etc.

However, it is to be noted that the proposed ADC system may be used not only in receivers for wireless signals. The proposed ADC system may, for example, be used for high precision instrumentation or wireline receivers as well. Therefore, examples of the present disclosure further relate to a receiver comprising an ADC system as proposed herein and analog circuitry configured to receive a receive signal from a wired transmission link. The analog circuitry is configured to supply an analog input signal to the ADC system based on the receive signal. For example, the analog circuitry may comprise one or more of a filter, a down-conversion mixer, ESD protection circuitry, an attenuator etc. Further, examples relate to any electronic device comprising the proposed ADC system.

The examples described herein may be summarized as follows:

Example 1 is a reference buffer circuit for an analog-to-digital converter, the reference buffer circuit comprising: a first input node configured to receive a first bias signal of a first polarity from a first signal line; a second input node configured to receive a second bias signal of a second polarity from a second signal line; a first output node configured to output a first reference signal of the first polarity, wherein a first buffer amplifier is coupled between the first input node and the first output node; a second output node configured to output a second reference signal of the second polarity, wherein a second buffer amplifier is coupled between the second input node and the second output node; a first coupling path comprising a first capacitive element, wherein the first coupling path is coupled between the first output node and the second input node; and a second coupling path comprising a second capacitive element, wherein the second coupling path is coupled between the second output node and the first input node.

Example 2 is the reference buffer circuit of example 1, wherein a capacitance of the first capacitive element is equal to a capacitance of the second capacitive element.

Example 3 is the reference buffer circuit of example 1 or example 2, wherein a respective capacitance of at least one of the first capacitive element and the second capacitive element is at minimum 50% and at maximum 150% of a gate-source capacitance of any transistor of the first buffer amplifier.

Example 4 is the reference buffer circuit of example 1, wherein the first coupling path additionally comprises at least one of first resistive element and a first inductive element, and wherein the second coupling path additionally comprises at least one of second resistive element and a second inductive element.

Example 5 is the reference buffer circuit of any of examples 1 to 4, wherein a third coupling path comprising a third capacitive element is coupled between the first input node and the second input node.

Example 6 is the reference buffer circuit of example 5, wherein a capacitance of the third capacitive element is equal to or greater than a gate-source capacitance of any transistor of the first buffer amplifier.

Example 7 is the reference buffer circuit of any of examples 1 to 6, further comprising a fourth capacitive element coupled between the first input node and a ground node.

Example 8 is the reference buffer circuit of example 7, wherein a capacitance of the fourth capacitive element is equal to or greater than a gate-source capacitance of any transistor of the first buffer amplifier.

Example 9 is the reference buffer circuit of any of examples 1 to 8, further comprising a fifth capacitive element coupled between the second input node and a ground node.

Example 10 is the reference buffer circuit of example 9, wherein a capacitance of the fifth capacitive element is equal to or greater than a gate-source capacitance of any transistor of the first buffer amplifier.

Example 11 is the reference buffer circuit of any of examples 1 to 10, wherein at least one the first buffer amplifier and the second buffer amplifier is a source follower circuit.

Example 12 is the reference buffer circuit of any of examples 1 to 10, wherein at least one the first buffer amplifier and the second buffer amplifier comprises cascaded source follower circuits.

Example 13 is an analog-to-digital converter, ADC, system, comprising: a biasing circuit configured to supply a first bias signal of a first polarity to a first signal line and a second bias signal of a second polarity to a second signal line; a plurality of sub-ADCs for digitizing an analog input signal, wherein the plurality of sub-ADCs are coupled to the first signal line and the second signal line for receiving the first bias signal and the second bias signal, and wherein at least one of the plurality of sub-ADCs comprises a reference buffer circuit according to any of examples 1 to 12 for coupling the at least one of the plurality of sub-ADCs to the first signal line and the second signal line.

Example 14 is the ADC system of example 13, wherein the at least one of the plurality of sub-ADCs further comprises: a first plurality of switches for selectively coupling a first plurality of loads to the first output node of the respective reference buffer; and a second plurality of switches for selectively coupling a second plurality of loads to the second output node of the respective reference buffer.

Example 15 is the ADC system of example 13 or example 14, wherein the plurality of sub-ADCs are time-interleaved.

Example 16 is the ADC system of example 13 or example 14, wherein the plurality of sub-ADCs are pipelined.

Example 17 is a receiver, comprising: an analog-to-digital converter system according to any of examples 13 to 15; and analog circuitry configured to receive a receive signal, and to supply the analog input signal to the analog-to-digital converter system based on the receive signal.

Example 18 is the receiver of example 17, wherein the receive signal is a radio frequency receive signal from an antenna element.

Example 19 is the receiver of example 17, wherein the analog circuitry is configured to receive the receive signal from a wired transmission link.

Example 20 is a base station, comprising: a receiver according to example 17 or example 18; and a transmitter configured to generate a radio frequency transmit signal.

Example 21 is the base station of example 20, further comprising at least one antenna element coupled to at least one of the receiver and the transmitter.

Example 22 is a mobile device, comprising: a receiver according to example 17 or example 18; and a transmitter configured to generate a radio frequency transmit signal.

Example 23 is the mobile device of example 22, further comprising at least one antenna element coupled to at least one of the receiver and the transmitter.

The aspects and features described in relation to a particular one of the previous examples may also be combined with one or more of the further examples to replace an identical or similar feature of that further example or to additionally introduce the features into the further example.

It is further understood that the disclosure of several steps, processes, operations or functions disclosed in the description or claims shall not be construed to imply that these operations are necessarily dependent on the order described, unless explicitly stated in the individual case or necessary for technical reasons. Therefore, the previous description does not limit the execution of several steps or functions to a certain order. Furthermore, in further examples, a single step, function, process or operation may include and/or be broken up into several sub-steps, -functions, -processes or -operations.

If some aspects have been described in relation to a device or system, these aspects should also be understood as a description of the corresponding method. For example, a block, device or functional aspect of the device or system may correspond to a feature, such as a method step, of the corresponding method. Accordingly, aspects described in relation to a method shall also be understood as a description of a corresponding block, a corresponding element, a property or a functional feature of a corresponding device or a corresponding system.

The following claims are hereby incorporated in the detailed description, wherein each claim may stand on its own as a separate example. It should also be noted that although in the claims a dependent claim refers to a particular combination with one or more other claims, other examples may also include a combination of the dependent claim with the subject matter of any other dependent or independent claim. Such combinations are hereby explicitly proposed, unless it is stated in the individual case that a particular combination is not intended. Furthermore, features of a claim should also be included for any other independent claim, even if that claim is not directly defined as dependent on that other independent claim.

What is claimed is:

1. A reference buffer circuit for an analog-to-digital converter, the reference buffer circuit comprising:
    a first input node configured to receive a first bias signal of a first polarity from a first signal line;
    a second input node configured to receive a second bias signal of a second polarity from a second signal line;
    a first output node configured to output a first reference signal of the first polarity, wherein a first buffer amplifier is coupled between the first input node and the first output node;
    a second output node configured to output a second reference signal of the second polarity, wherein a second buffer amplifier is coupled between the second input node and the second output node;
    a first coupling path comprising a first capacitive element, wherein the first coupling path is coupled between the first output node and the second input node; and
    a second coupling path comprising a second capacitive element, wherein the second coupling path is coupled between the second output node and the first input node; and
    a third coupling path comprising a third capacitive element coupled between the first input node and the second input node.

2. The reference buffer circuit of claim 1, wherein a capacitance of the first capacitive element is equal to a capacitance of the second capacitive element.

3. The reference buffer circuit of claim 1, wherein a respective capacitance of at least one of the first capacitive element and the second capacitive element is at minimum 50% and at maximum 150% of a gate-source capacitance of any transistor of the first buffer amplifier.

4. The reference buffer circuit of claim 1, wherein the first coupling path additionally comprises at least one of first resistive element and a first inductive element, and wherein the second coupling path additionally comprises at least one of second resistive element and a second inductive element.

5. The reference buffer circuit of claim 1, wherein a capacitance of the third capacitive element is equal to or greater than a gate-source capacitance of any transistor of the first buffer amplifier.

6. The reference buffer circuit of claim 1, further comprising a fourth capacitive element coupled between the first input node and a ground node.

7. The reference buffer circuit of claim 6, wherein a capacitance of the fourth capacitive element is equal to or greater than a gate-source capacitance of any transistor of the first buffer amplifier.

8. The reference buffer circuit of claim 1, further comprising a fifth capacitive element coupled between the second input node and a ground node.

9. The reference buffer circuit of claim 8, wherein a capacitance of the fifth capacitive element is equal to or greater than a gate-source capacitance of any transistor of the first buffer amplifier.

10. The reference buffer circuit of claim 1, wherein at least one the first buffer amplifier and the second buffer amplifier is a source follower circuit.

11. The reference buffer circuit of claim 1, wherein at least one the first buffer amplifier and the second buffer amplifier comprises cascaded source follower circuits.

12. An analog-to-digital converter, ADC, system, comprising:
    a biasing circuit configured to supply a first bias signal of a first polarity to a first signal line and a second bias signal of a second polarity to a second signal line;
    a plurality of sub-ADCs for digitizing an analog input signal, wherein the plurality of sub-ADCs are coupled to the first signal line and the second signal line for receiving the first bias signal and the second bias signal, and wherein at least one of the plurality of sub-ADCs comprises a reference buffer circuit according to claim 1 for coupling the at least one of the plurality of sub-ADCs to the first signal line and the second signal line.

13. The ADC system of claim 12, wherein the at least one of the plurality of sub-ADCs further comprises:
    a first plurality of switches for selectively coupling a first plurality of loads to the first output node of the respective reference buffer; and
    a second plurality of switches for selectively coupling a second plurality of loads to the second output node of the respective reference buffer.

14. The ADC system of claim 12, wherein the plurality of sub-ADCs are time-interleaved.

15. The ADC system of claim 12, wherein the plurality of sub-ADCs are pipelined.

16. A receiver, comprising:
    an analog-to-digital converter system according to claim 12; and
    analog circuitry configured to receive a receive signal, and to supply the analog input signal to the analog-to-digital converter system based on the receive signal.

17. The receiver of claim 16, wherein the receive signal is a radio frequency receive signal from an antenna element.

18. The receiver of claim 16, wherein the analog circuitry is configured to receive the receive signal from a wired transmission link.

19. A base station, comprising:
    a receiver according to claim 16; and
    a transmitter configured to generate a radio frequency transmit signal.

20. The base station of claim 19, further comprising at least one antenna element coupled to at least one of the receiver and the transmitter.

* * * * *